(12) United States Patent
Sun et al.

(10) Patent No.: US 10,578,754 B2
(45) Date of Patent: Mar. 3, 2020

(54) SINUSOIDAL EXCITATION METHOD AND APPARATUS FOR MULTI-POLE ACOUSTIC LOGGING WHILE DRILLING

(71) Applicant: Institute of Geology and Geophysics, Chinese Academy of Sciences, Beijing (CN)

(72) Inventors: Yuntao Sun, Beijing (CN); Zili Wang, Beijing (CN); Wenxuan Chen, Beijing (CN); Wenxiu Zhang, Beijing (CN); Yongyou Yang, Beijing (CN); Qingyun Di, Beijing (CN); Jian Zheng, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 16/193,855

(22) Filed: Nov. 16, 2018

(65) Prior Publication Data

US 2019/0129046 A1 May 2, 2019

Related U.S. Application Data

(63) Continuation-in-part of application No. 15/708,984, filed on Sep. 19, 2017, now abandoned.

(30) Foreign Application Priority Data

Jan. 19, 2017 (CN) .......................... 2017 1 0044225

(51) Int. Cl.
*G01V 1/00* (2006.01)
*E21B 49/00* (2006.01)
(Continued)

(52) U.S. Cl.
CPC .............. *G01V 1/005* (2013.01); *E21B 49/00* (2013.01); *G01V 1/04* (2013.01); *G01V 1/40* (2013.01);
(Continued)

(58) Field of Classification Search
USPC .......................................................... 367/87
See application file for complete search history.

(56) References Cited

U.S. PATENT DOCUMENTS 3,320,803 A 5/1967 Lord
3,724,589 A 4/1973 Chapman, III
(Continued)

FOREIGN PATENT DOCUMENTS

CN 1740746 A 3/2006
CN 2849164 Y 12/2006
(Continued)

*Primary Examiner* — James R Hulka
(74) *Attorney, Agent, or Firm* — Novick, Kim & Lee, PLLC; Allen Xue (57) ABSTRACT

In an apparatus for multi-pole acoustic logging while drilling, a N-cycle sinusoidal wave signal is generated by utilizing a signal processor, and amplified into a high-voltage sinusoidal excitation signal by utilizing a power amplifier, and output to a transmitting transducer. The signal processor simultaneously generates an enable signal. The enable signal includes a transient discharge enable signal. The power amplifier is connected with a transient discharge circuit. After the signal processor generates N cycles of a sinusoidal wave, the transient discharge enable signal enables the transient discharge circuit to discharge to release an energy storage current of a power transformer so as to eliminate a high-voltage ringing effect and improve an excitation efficiency of the transducer.

8 Claims, 5 Drawing Sheets

(51) Int. Cl.
  *G01V 1/40* (2006.01)
  *H02M 7/538* (2007.01)
  *H03F 3/26* (2006.01)
  *G01V 1/44* (2006.01)
  *G01V 1/04* (2006.01)
  *H03F 3/45* (2006.01)

(52) U.S. Cl.
  CPC .............. *G01V 1/44* (2013.01); *H02M 7/538* (2013.01); *H03F 3/265* (2013.01); *H03F 3/45475* (2013.01); *G01V 2200/16* (2013.01); *G01V 2210/121* (2013.01); *G01V 2210/1214* (2013.01); *G01V 2210/32* (2013.01); *G01V 2210/6161* (2013.01); *H03F 2200/541* (2013.01)

(56) References Cited

U.S. PATENT DOCUMENTS

| | | | |
|---|---|---|---|
| 7,096,313 | B1 | 8/2006 | Chang et al. |
| 7,762,854 | B1 | 7/2010 | Peng |
| 2001/0012703 | A1 | 8/2001 | Wurm et al. |
| 2002/0075114 | A1 | 6/2002 | Hall et al. |
| 2002/0177954 | A1 | 11/2002 | Vail |
| 2003/0107371 | A1 | 6/2003 | Engdahll et al. |
| 2007/0247329 | A1 | 10/2007 | Petrovic et al. |
| 2008/0300791 | A1 | 12/2008 | Sinclair et al. |
| 2009/0023502 | A1 | 1/2009 | Koger |
| 2009/0153355 | A1 | 6/2009 | Price et al. |
| 2010/0302060 | A1 | 12/2010 | Montgomery et al. |
| 2012/0249338 | A1 | 10/2012 | Merino |
| 2012/0299743 | A1 | 11/2012 | Price et al. |
| 2013/0154844 | A1 | 6/2013 | Montgomery et al. |
| 2013/0184995 | A1 | 7/2013 | Sinclair et al. |
| 2014/0015530 | A1 | 1/2014 | Miles et al. |
| 2014/0332235 | A1 | 11/2014 | Mueller et al. |
| 2014/0375320 | A1 | 12/2014 | Liu et al. |
| 2015/0008928 | A1 | 1/2015 | Miles et al. |
| 2015/0028875 | A1 | 1/2015 | Irie et al. |
| 2017/0176243 | A1 | 6/2017 | Ellmauthaler et al. |
| 2018/0202287 | A1* | 7/2018 | Sun ................ H03F 3/265 |

FOREIGN PATENT DOCUMENTS

| | | |
|---|---|---|
| CN | 101289935 A | 10/2008 |
| CN | 201221354 Y | 4/2009 |
| CN | 101493008 A | 7/2009 |
| CN | 102418516 A | 4/2012 |
| CN | 202187758 U | 4/2012 |
| CN | 103061755 A | 4/2013 |
| CN | 103577121 A | 2/2014 |
| CN | 204283400 U | 4/2015 |
| CN | 204283413 U | 4/2015 |
| CN | 105353357 A | 2/2016 |
| CN | 105760113 A | 7/2016 |
| CN | 105804722 A | 7/2016 |
| CN | 206299372 U | 7/2017 |
| CN | 206299375 U | 7/2017 |

* cited by examiner

SINUSOIDAL EXCITATION METHOD AND APPARATUS FOR MULTI-POLE ACOUSTIC LOGGING WHILE DRILLING

TECHNICAL FIELD

The present invention belongs to the field of signal excitation, and particularly relates to a sinusoidal excitation method and apparatus for multi-pole acoustic logging while drilling (LWD).

BACKGROUND

The logging while drilling (LWD) technology has been developing rapidly since the 1980s. Compared with conventional wireline logging, LWD provides important information in an oil exploration and development process immediately and accurately, and provides a reliable technical support for improving the operating efficiency. LWD involves acoustics, telecommunications, nuclear magnetism, radioactivity, and other disciplines. In recent years, LWD instruments have been developed. LWD instruments has advanced from monopoles and dipoles to towards multi-pole LWD nowadays. Multi-pole LWD is used for obtaining information such as the compression velocity, the shear velocity, the porosity of a stratum, as well as the permeability and the stability of the borehole wall.

A conventional wireline acoustic logging instrument is affected by drilling noises, drilling fluid circulation noises, and a drill collar wave. A broadband, high-power, and high-efficiency excitation manner is crucial to obtain high-quality acoustic logging data. A traditional acoustic excitation manner commonly adopts a rectangular pulse excitation manner, and a width of a pulse is related to a resonant frequency of a transmitting transducer. In general, the pulse width is one-half of the resonant frequency. However, under such an operating condition, choices for the basic frequency is limited because it requires impedance matching between the power transformer and the transmitting transducer, which strictly operates on the resonant basic frequency of the transmitting transducer. The multi-pole LWD operating at multiple frequency points, if such a method is employed, it is necessary to select a plurality of power transformers and transmitting transducers to achieve resonance at different frequency points. This will greatly increase the design complexity and research and development costs of the instrument.

Nowadays a sinusoidal wave pulse excitation source is commonly employed for the multi-pole acoustic LWD instrument.

Because a rectangular pulse occupies a relatively wide frequency band in a frequency domain, it is relatively low in system power consumption and excitation efficiency in comparison with a sinusoidal pulse excitation. An acoustic LWD transmitting transducer excitation method adopting a sinusoidal pulse is more efficient than a rectangular pulse excitation manner. An excitation emission transducer with peak efficiency may be realized by adopting a sinusoidal wave excitation by changing a frequency of a sinusoidal wave without changing resonance frequency points of the power amplifier and the transmitting transducer.

Currently, three cycles of a sinusoidal wave is commonly used as an excitation pulse of the transmitting transducer. For the multi-pole acoustic LWD instrument, three cycles of the sinusoidal wave require at least two frequency points to excite the transmitting transducer to operate. Monopoles, dipoles, polarizers and quadru-poles do not operate at one frequency point. In the actual operation, the acoustic LWD using the sinusoidal wave excitation has the following two problems:

1. a high-voltage source generated by excitation is always on so that the energy storage capacitor connected to the power source is always in a charged state, which wastes power; and 2. in the case where the power transformer and the transmitting transducer do not operate at a resonant frequency point (in general, multi-pole acoustic excitation operates at two or more frequency points), or are not matched well. In a three-cycle sinusoidal wave excitation process, a magnet inside the power transformer stores energy. Once the three-cycle sinusoidal wave excitation is over, the power transformer will release the stored energy, creating a shock trailing smear (so-called high-voltage ringing effect), behind a three-cycle sinusoidal wave excitation signal, which has a negative impact on an excitation effect of the transmitting transducer.

These two problems will increase the system power consumption, and reduce the excitation efficiency of the transducer.

SUMMARY

In view of the above-mentioned problems, the present invention provides a sinusoidal wave excitation method and apparatus for multi-pole acoustic LWD. A method for discharging a controllable high-voltage power supply and a transient power transformer adopting sinusoidal wave pulse excitation is provided, which improves the transmitting efficiency while reducing the system power consumption.

In one of the embodiments in the current disclosure, a sinusoidal excitation method for multi-pole acoustic LWD includes the following steps: generating a N-cycle sinusoidal wave signal by utilizing a signal processor; amplifying the sinusoidal wave signal into a high-voltage sinusoidal excitation signal by utilizing a power amplifier, and outputting it to a transmitting transducer; and generating an enable signal by the signal processor, wherein the enable signal includes a transient discharge enable signal.

The power amplifier is connected with a transient discharge circuit. After the signal processor generates N cycles of a sinusoidal wave, the transient discharge enable signal enables the transient discharge circuit to discharge and release an energy storage current of a power transformer, so as to eliminate a high-pressure ringing effect and improve an excitation efficiency of the transducer.

Further, the transient discharge circuit includes a gate drive chip and two power MOS transistors. The two MOS transistors are connected in parallel. Gates of the MOS transistors connected in parallel are further connected with the gate drive chip. Sources of the MOS transistors connected in parallel are connected with a resistor. And drains of the MOS transistors connected in parallel are connected with two primary ports of the power amplifier, respectively. The other end of the resistor is grounded; and After the signal processor generates N cycles of the sinusoidal wave, the enable signal controls the gates of the two MOS transistors to enable the MOS transistors to be immediately conducted after passing through the gate drive chip, and an energy storage current of the power transformer is rapidly discharged by means of the resistor.

Further, the power transformer is connected with a high-voltage generating circuit, and the high-voltage generating circuit provides a high-voltage drive to the power amplifier. The high-voltage generating circuit includes a high-voltage power supply module and a high-voltage energy storage capacitor, and the high-voltage power supply module converts a low voltage into a high voltage to be output to the high-voltage energy storage capacitor for charging the high-voltage energy storage capacitor, and the high-voltage energy storage capacitor is connected with the power amplifier to provide the high-voltage drive to the power amplifier. The enable signal further includes a high-voltage power supply enable signal The high-voltage power supply module includes an enable control terminal, and the enable control terminal is connected with the signal processor. The high-voltage power supply enable signal controls the enable control terminal, and after the signal processor generates N cycles of the sinusoidal wave, an output of the high-voltage power supply module is rapidly cut off.

Further, the power amplifier includes a Class B push-pull amplifier circuit and a power transformer, wherein the power transformer has a center tap, a primary port and a secondary port, the primary port has a center tap, and an inductance of the power transformer is matched with an impedance of the transmitting transducer.

Further, a valid time of the transient discharge enable signal is adjusted according to a magnetic core material of the power transformer, a turns ratio, and a peak voltage of the transducer.

Further, a resistance of the resistor R8 is less than 1 ohm.

Further, the signal processor is a signal processor with an analog signal output function or a combination of a digital signal processor and a digital-to-analog converter.

In another embodiment of the current disclosure, a sinusoidal excitation apparatus for multi-pole acoustic LWD adopts the above excitation method and includes a signal processing module, a high-voltage generating module, a power amplification module and a transient discharge module. The high-voltage generating module includes a high-voltage generating circuit and a high-voltage generating circuit closing module. The transient discharge module includes a transient discharge circuit and a transient discharge circuit conducting module. The signal processing module generates a sinusoidal signal and an enable signal. The enable signal controls the turning on of the high-voltage generating circuit closing module and the transient discharge circuit conducting module.

The present invention has advantageous effects:

(1) the excitation method of the present invention uses an externally connected the discharge circuit to quickly release the energy stored in the power transformer so as to eliminate the high-voltage ringing effect of the power transformer; and (2) the present invention adopts a manner of the controllable high-voltage power supply to reduce the system power consumption in a non-operating state.

DETAILED DESCRIPTION

Objectives, technical solutions and advantages of the present invention will become more apparent from the following detailed description of the present invention when taken in conjunction with accompanying drawings. It should be understood that specific embodiments described herein are merely illustrative of the present invention and are not intended to limit the present invention.

Rather, the present invention encompasses any alternatives, modifications, equivalents, and solutions made within the spirit and scope of the present invention as defined by the claims. Further, in order to give the public a better understanding of the present invention, some specific details are described below in detail in the following detailed description of the present invention. It will be appreciated by those skilled in the art that the present invention may be understood without reference to the details.

Example 1

The present disclosure provides an implementation method for an acoustic logging excitation circuit. The method is used in acoustic logging tool in oil and gas exploration. The acoustic logging excitation circuit traditionally uses rectangular pulses, and has a characteristic of easy implementation of hardware thereby being popularized. However, since the acoustic logging excitation circuit adopts positive pulses, and has a wide band, its excitation manner is inefficient. With advances in technology, a sinusoidal excitation manner is widely employed, which is characterized by complex hardware and high efficiency. The present discloses a hardware implementation method of sinusoidal excitation and a method for eliminating excitation tailing vibration, and gives an implementation effect.

Figure 1:
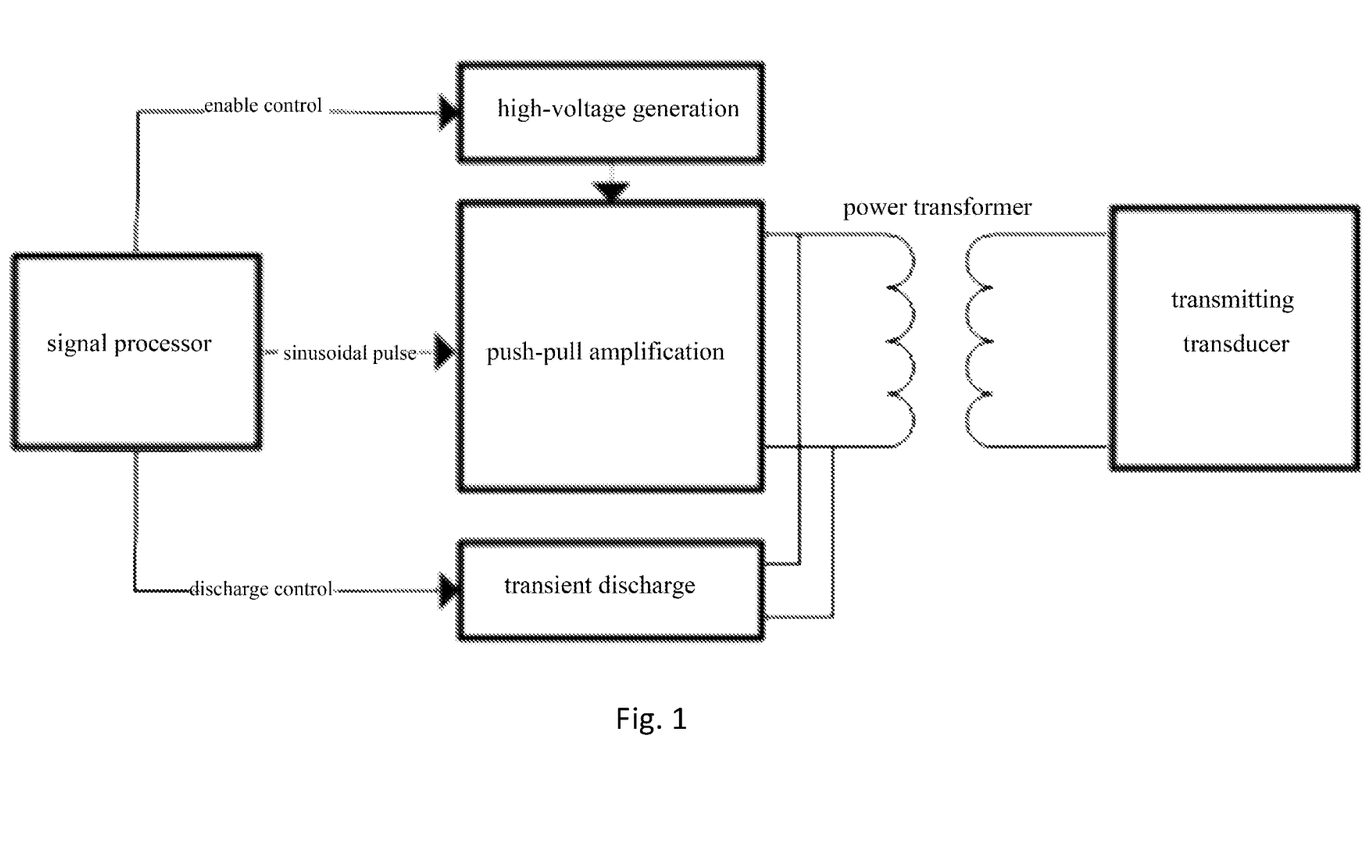
FIG. 1 is a schematic diagram of a sinusoidal excitation structure for multi-pole acoustic LWD.
Figure 2:
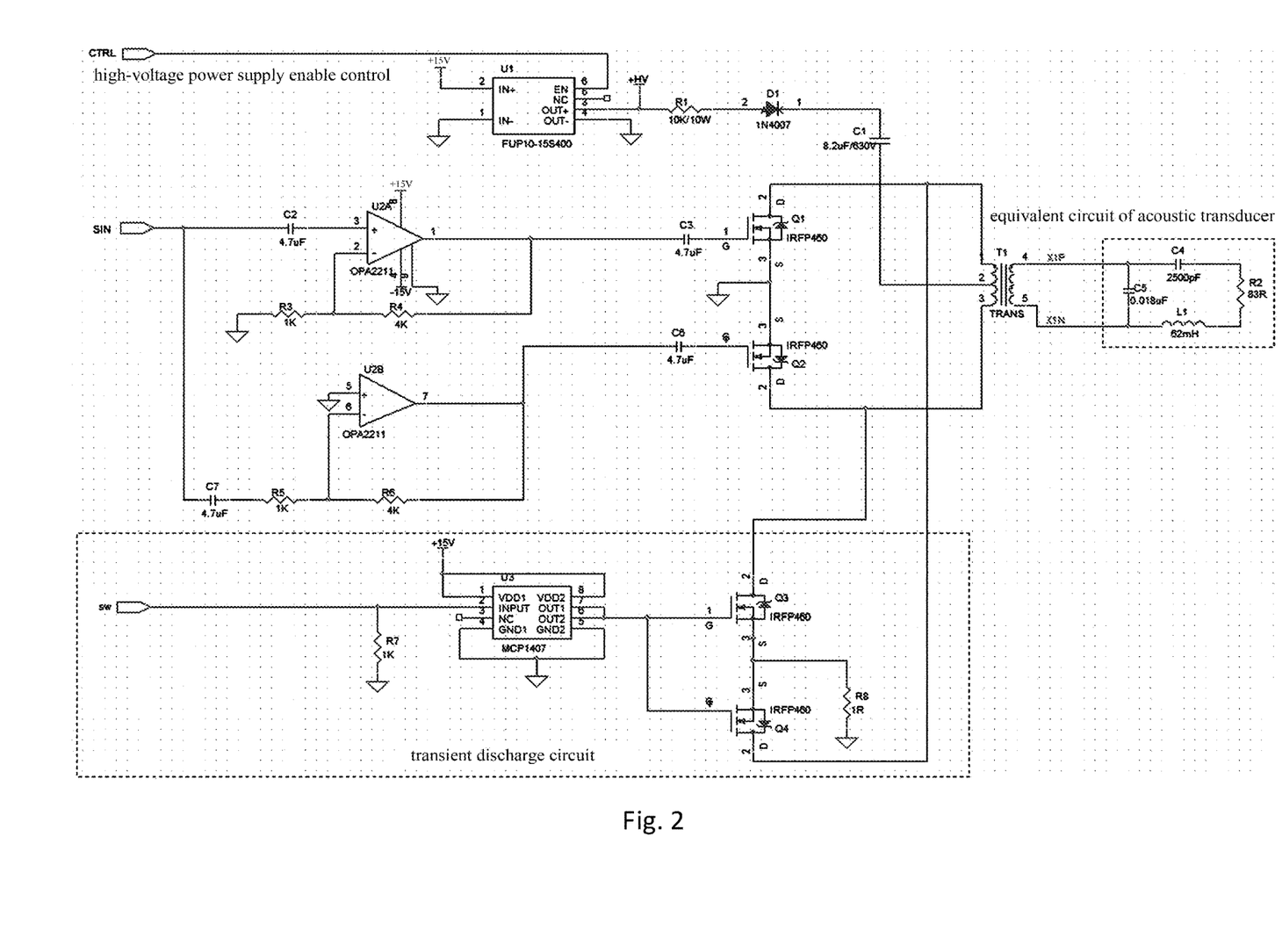
FIG. 2 is a schematic diagram of a sinusoidal excitation circuit for multi-pole acoustic LWD

One embodiment of the signal generating circuit has a DCDC power generation circuit, a push-pull amplifier circuit, a signal processor, and a power transformer During operation, the signal generating circuit and the device go through the following steps as shown in FIGS. 1 and 2.

In step 1, firstly, an acoustic high-voltage generating module generates a high voltage of 200V-400V under an action of an "enable control" signal of an output control end of the signal processor, with the total output power not exceeding 10 W. This module is implemented by employing a conventional DCDC power generating manner, that is, the high voltage of 200V-400V is generated through such a DCDC module from a low voltage of 10V-15V to charge an energy storage capacitor. The capacity of the energy storage capacitor is about 6.8 μF. To withstand the high-temperature environment downhole, VJ3640 series ceramic capacitors produced by Vishay were used, and 10 680 μF capacitors were connected in parallel. After the energy storage capacitor is fully charged, the voltage reaches 200V-400V, and the push-pull amplifier circuit is expected to instantaneously discharge to generate a high-voltage pulse.

In step 2, the signal processor generates a three-cycle low-voltage sinusoidal pulse signal. The resulting sinusoidal pulse signal has a frequency which is adjustable from 3 kHz to 15 kHz and an amplitude of 0 V-3.3 V low voltage. ST's STM32 series ARM processors served as the signal processor. Such a three-cycle low-voltage sinusoidal pulse signal was subjected to a typical dual-operational amplifier push-pull amplification, and the high voltage of the energy storage capacitor was instantaneously discharged, so that a high-voltage sinusoidal pulse was generated at a primary side of the power transformer. An interval between excitations is in the range of 2-6 seconds, preferably 3-5 seconds. It is necessary to ensure that the energy storage capacitor is already full of charges before the next discharge.

In step 3, the power transformer is of a turns ratio of 1 to 5. The high-voltage sinusoidal pulse of 200-400 V generated at the primary side forms a 5× amplified signal at a secondary side so that a pulse of 1000V-2000V is generated. Thereby, a transmitting transducer is excited to convert an electrical signal into an acoustic signal.

Due to a hysteresis effect of the power transformer, serious tailing excitation would occur after the three-cycle excitation signal ends, and the duration may be up to hundreds of microseconds. In step 4, of the method of current embodiment implements instantaneous discharge by means of chopped waves. In particular, two ends of the primary side of the power transformer are grounded quickly to implement short-circuiting at an ending position of the 3-cycle sinusoidal signal. As shown in FIG. 2, the instantaneous discharge circuit includes two high-power MOSFETs. A 3.3 V discharge control signal is output by the signal processor at the end of the excitation signal, which realizes an instantaneous grounding short-circuiting of the two MOSFETs through a MOSFET driver chip MCP1407ES. As such, an instantaneous discharge with the chopped waves (chopped tailing vibration) is achieved.

Figure 3:
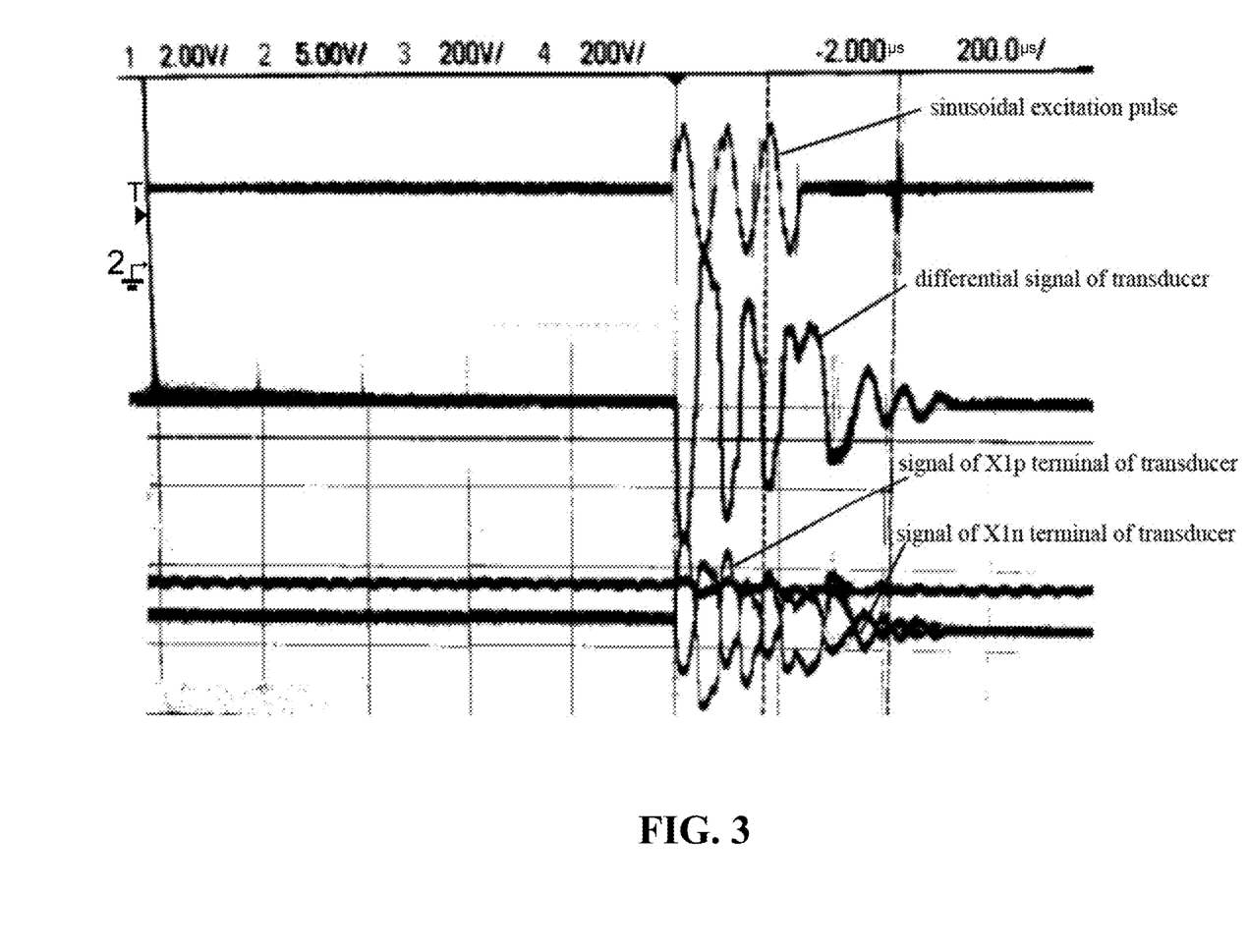
FIG. 3 is a schematic diagram of a sinusoidal excitation signal when a valid time of a SW enable signal of a transient discharge circuit is 100 μs and signals loaded on a point X1$p$ and a point X1$n$ of a transducer according to an embodiment.
Figure 4:
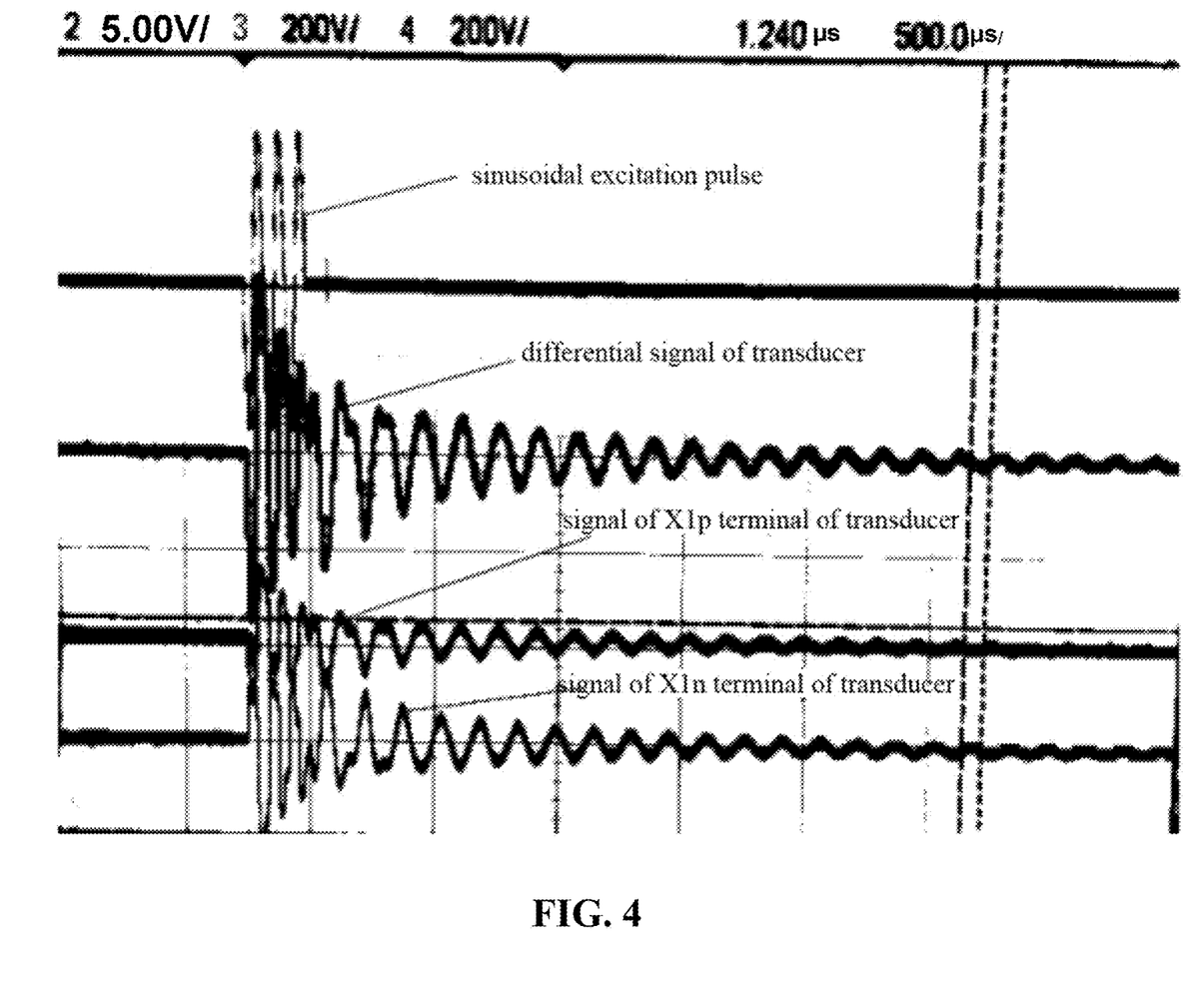
FIG. 4 is a schematic diagram of a sinusoidal excitation signal when a valid time of a SW enable signal of a transient discharge circuit is 200 μs and signals loaded on a point X1$p$ and a point X1$n$ of a transducer according to an embodiment.
Figure 5:
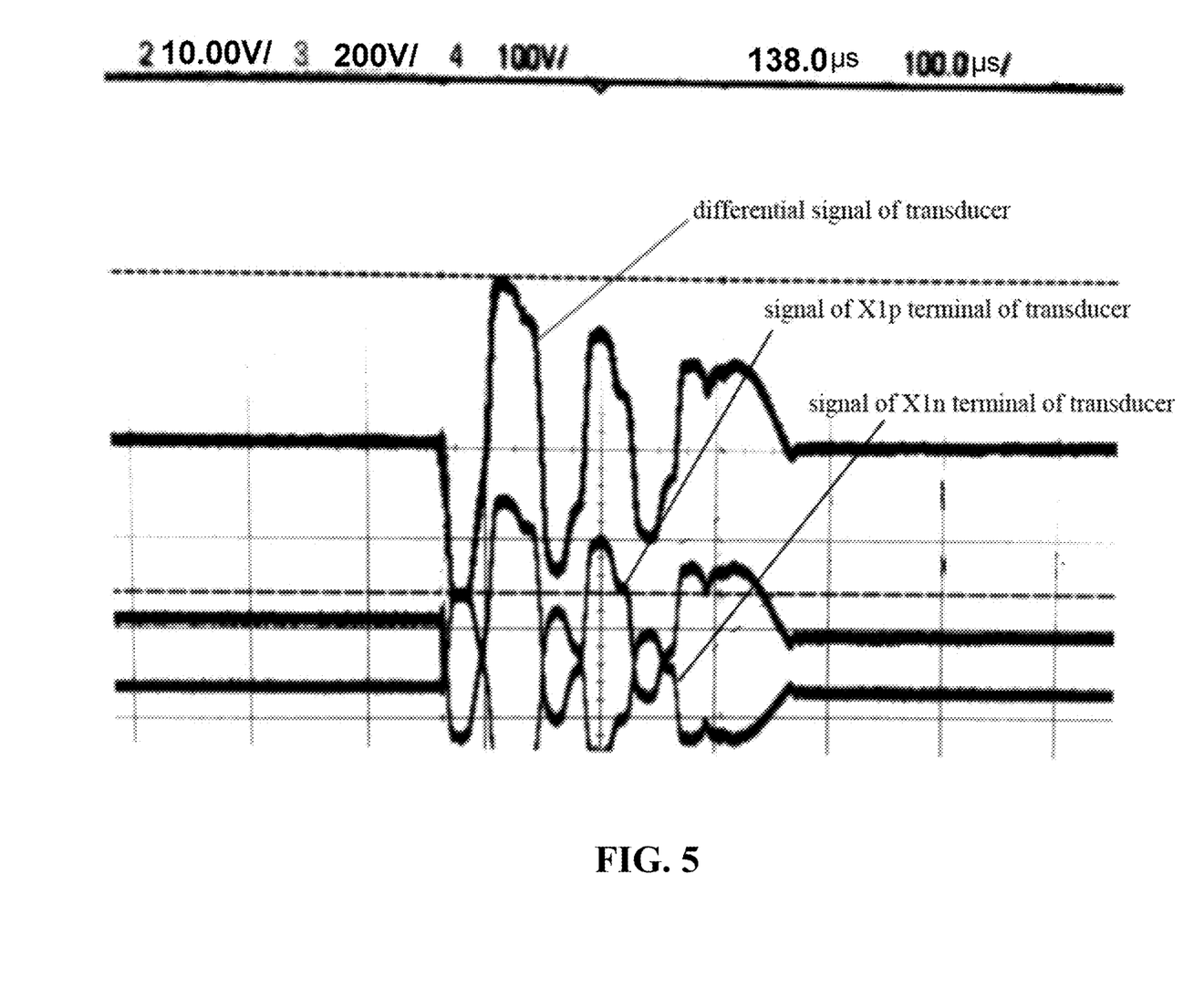
FIG. 5 is a schematic diagram of a sinusoidal excitation signal when a valid time of a SW enable signal of a transient discharge circuit is 400 μs and signals loaded on a point X1$p$ and a point X1$n$ of a transducer according to an embodiment.

The particularly implemented effect has been described in detail in the description of the present invention. Among them, FIG. 3 shows a serious tailing phenomenon occurring without an instantaneous discharge circuit. FIG. 4 and FIG. 5 show effects achieved after an instantaneous discharge circuit was employed.

In step 5, after generating the 3-cycle sinusoidal pulse excitation signal, and after the high-voltage generating module completes charging of the energy storage capacitor, the signal processor waits for a period of time, e.g., 2-6 seconds or 3-5 seconds, before transmitting the next three-cycle sinusoidal signal, thereby achieving the next excitation of the transmitting transducer.

A sinusoidal excitation structure for multi-pole acoustic LWD is shown in FIG. 1. A three-cycle sinusoidal wave signal SIN with an amplitude of a 3.3 v peak-to-peak value is generated using a DSP signal processor. A low-voltage sinusoidal wave (3.3 V peak value) output by the signal processor DSP is amplified into a 400V sinusoidal wave excitation signal by adopting a class B push-pull amplifier circuit. A sinusoidal wave excitation signal, output from the push-pull amplifier circuit, with a 400 V peak value is amplified into a sinusoidal wave excitation signal with a 2000 V peak value by utilizing a power transformer with a turns ratio of 1:5.

The signal processor also send an enable control signal of 10 V to 15 V to the high-voltage generation circuit, which generates a 200-400 V power of less than 10 W. The 200-400 V power is provided to the power transformer. An inductance of the power transformer is set according to an equivalent circuit of an acoustic transmitting transducer to achieve impedance matching of a transmitting circuit. A signal is output to the transmitting transducer.

The power transformer has a center tap, two input ports and one output port.

The high-voltage generating circuit includes a high-voltage power supply module and a high-voltage energy storage capacitor C1. The high-voltage power supply module converts the low voltage into a high voltage to be output to the high-voltage energy storage capacitor C1 to charge the high-voltage energy storage capacitor C1. The high-voltage energy storage capacitor C1 is connected with the power amplifier to provide a high-voltage drive to the power amplifier.

The signal processor DSP generates a transient discharge enable signal SW and a power amplifier is connected with a transient discharge circuit. After the signal processor generates three cycles of a sinusoidal wave, the transient discharge enable signal SW enables the transient discharge circuit to discharge to release an energy storage current of the power amplifier, so as to eliminate a high-pressure ringing effect and improve an excitation efficiency of the transducer.

The transient discharge circuit includes a gate drive chip U3 and two diodes Q3 and Q4. The two diodes are connected in parallel. The gates of the diodes connected in parallel are connected with the gate drive chip U3. The sources of the diodes connected in parallel are connected with a resistor R8. The drains of the diodes connected in parallel are respectively connected with two output ends of the power amplifier. The other end of the resistor R8 is grounded. After the signal processor generates N cycles of a sinusoidal wave with a frequency f, an enable signal controls the gates of the two diodes Q3 and Q4 to immediately conduct the diodes after passing through the gate drive chip U3. The energy storage current of the power amplifier is rapidly discharged by means of the resistor R8. A resistance of the resistor R8 is below 1 ohm. The smaller the resistance of the resistor R8 is, the rapider a discharge speed is.

Moreover, the signal processor DSP generates a high-voltage power supply enable signal CNRL. The high-voltage power supply module includes an enable control terminal EN. The enable control terminal EN is connected with the signal processor.

The high-voltage power supply enable signal CNRL controls the enable control terminal EN. After the signal processor generates three cycles of the sinusoidal wave, an output of the high-voltage power supply module is rapidly cut off. The high-voltage power supply module U1 converts a direct-current power supply with a low voltage 15 V into a direct-current power supply +HV with a high voltage 400 V under the enabling of the control signal CTRL. The direct-current power supply +HV with a high voltage 400 V charges the high-voltage energy storage capacitor C1 through a current-limiting resistor R1 (an output power is controlled at 10 W). D1 is a current-limiting diode, which prevents the current from being too large to damage the high-voltage power supply module and the discharge circuit behind it.

A schematic diagram of a sinusoidal excitation circuit for multi-pole acoustic LWD is as shown in FIG. 2.

A sinusoidal excitation apparatus for multi-pole acoustic LWD adopts the above excitation method.

A relationship between sinusoidal excitation signals when valid times of enable signals SW of a transient discharge circuit are 100 µs, 200 µs and 400 µs and signals loaded on a point X1p and a point X1n of a transducer is as shown in FIG. 3 to FIG. 5.

It can be seen from FIG. 3, after excitation of three cycles of a sinusoidal pulse when the valid time is 100 µs, a ringing amplitude is reduced but not obvious, and a ringing trailing smear is longer. It is indicated that a function of the transient discharge circuit is not obvious under this state. The high-voltage ringing effect of the power transformer is eliminated well.

It can be seen from FIG. 4, when the valid time of the enable signal SW of the transient discharge circuit is 200 µs, it may be seen that after excitation of three cycles of the sinusoidal pulse, there are some trailing smears. However, the function of the transient discharge circuit is obvious, and most of the energy storage current of the power transformer is released, so that its ringing effect is reduced.

It can be seen from FIG. 5, when the valid time of the enable signal SW of the transient discharge circuit is 400 µs, it may be seen that after excitation of three cycles of the sinusoidal pulse, there are no trailing smears. However, it is indicated that the function of the transient discharge circuit is obvious, and the energy storage current of the power transformer is basically released, so that its ringing effect is reduced.

In a further embodiment, a sinusoidal excitation apparatus for multi-pole acoustic LWD adopts the above excitation method. The apparatus includes a signal processing module, a high-voltage generating module, a power amplification module and a transient discharge module. The high-voltage generating module includes a high-voltage generating circuit and a high-voltage generating circuit closing module, and the transient discharge module includes a transient discharge circuit and a transient discharge circuit conducting module. The signal processing module generates a sinusoidal signal and an enable signal, and the enable signal controls the turning on of the high-voltage generating circuit closing module and the transient discharge circuit conducting module

The invention claimed is:

1. A sinusoidal excitation method for multi-pole acoustic logging while drilling, comprising:
    generating a sinusoidal wave signal, an enable control signal, and a discharge enable signal in a signal processor;
    amplifying the sinusoidal wave signal into a sinusoidal excitation signal in a power amplifier, wherein the power amplifier is coupled to a primary side of the power transformer;
    outputting the sinusoidal excitation signal to a transmitting transducer through the power transformer, wherein the transmitting transducer is coupled to a secondary side of the power transformer;
    outputting an acoustic signal from the transmitting transducer to a subsurface formation surrounding a wellbore;
    transmitting the discharge enable signal to discharge circuit coupled with a to the primary side of the power transformer;
    discharging an energy stored in the power transformer through the discharge circuit,
    wherein the discharge circuit comprises a gate drive chip and two MOS transistors connected in parallel, gates of the two parallelly connected MOS transistors are connected with the gate drive chip, sources of the two parallelly connected MOS transistors are connected with a first end of a resistor, and drains of the two parallelly connected MOS transistors are connected with two primary ports of the power amplifier, respectively, a second end of the resistor is grounded, and
    wherein, in the discharging step, the discharge enable signal passes through the gate drive chip and controls the gates of the two parallelly connected MOS transistors to turn on the two parallelly connected MOS transistors so that the energy stored in the power transformer is discharged via the resistor.

2. The sinusoidal excitation method for multi-pole acoustic logging while drilling according to claim 1, wherein a duration of the discharge enable signal is 100 µs to 400 µs.

3. The sinusoidal excitation method for multi-pole acoustic logging while drilling according to claim 1, wherein the sinusoidal wave signal is a 3-cycle sinusoidal wave signal.

4. The sinusoidal excitation method for multi-pole acoustic logging while drilling according to claim 1, further comprising adjusting a duration of the discharge enable signal.

5. The sinusoidal excitation method for multi-pole acoustic logging while drilling according to claim 1, wherein a resistance of the resistor is less than 1 ohm.

6. The sinusoidal excitation method for multi-pole acoustic logging while drilling according to claim 1, wherein the signal processor has an analog signal output function or a combination of a digital signal processor and a digital-to-analog converter.

7. A sinusoidal excitation apparatus for multi-pole acoustic logging while drilling, comprising:
    a signal processor, a high-voltage generating module, a power amplifier, a power transformer, and a discharge module,
    wherein the sinusoidal excitation apparatus is installed in a drill string,
    wherein the signal processor is connected with and sends signals to the high-voltage generating module, the power amplifier, and the discharge module, respectively,
    wherein the power amplifier is coupled to a primary side of the power transformer and the transient discharge module is coupled to a secondary side the power transformer,
    wherein the high-voltage generating module comprises a high-voltage generating circuit and a high-voltage generating circuit closing module, and the discharge module comprises a discharge circuit and a discharge circuit conducting module, and
    wherein the discharge circuit comprises a gate drive chip and two high-power MOS transistors, wherein the two MOS transistors are connected in parallel, gates of the two parallelly connected MOS transistors are connected with the gate drive chip, sources of the two parallelly connected MOS transistors are connected with a first end of a resistor, and drains of the two parallelly connected MOS transistors are connected with two primary ports of the power amplifier, respectively, a second end of the resistor is grounded.

8. The sinusoidal excitation apparatus according to claim 7, wherein the power amplifier comprises a Class B push-pull amplifier circuit and a power transformer, wherein the power transformer has a center tap, a primary port and a secondary port, the primary port has a center tap, and an inductance of the power transformer matches an impedance of the transmitting transducer.

* * * * *

UNITED STATES PATENT AND TRADEMARK OFFICE
CERTIFICATE OF CORRECTION

PATENT NO. : 10,578,754 B2  
APPLICATION NO. : 16/193855  
DATED : March 3, 2020  
INVENTOR(S) : Yuntao Sun et al.

Page 1 of 1

It is certified that error appears in the above-identified patent and that said Letters Patent is hereby corrected as shown below:

In the Claims

Column 7, Claim 1, Line 57:
"transmitting the discharge enable signal to discharge"
Should read:
--transmitting the discharge enable signal to a discharge--

Column 7, Claim 1, Line 58:
"circuit coupled with a to the primary side of the power"
Should read:
--circuit coupled to the primary side of the power--

Signed and Sealed this  
Thirty-first Day of March, 2020

Andrei Iancu  
*Director of the United States Patent and Trademark Office*